United States Patent
Lee et al.

(10) Patent No.: US 9,842,862 B2
(45) Date of Patent: Dec. 12, 2017

(54) FLEXIBLE ELECTRONIC DEVICE WITH ANTI-INTERFERENCE STRUCTURES AND MANUFACTURING METHOD THEREOF

(71) Applicants: HannStar Display (Nanjing) Corporation, Nanjing (CN); HANNSTAR DISPLAY CORPORATION, Taipei (TW)

(72) Inventors: Hsing-Ying Lee, Taipei (TW); Da-Ching Tang, Taipei (TW); Tien-Rong Lu, Taipei (TW)

(73) Assignees: HANNSTAR DISPLAY (NANJING) CORPORATION, Nanjing (CN); HANNSTAR DISPLAY CORPORATION, Taipei (TW)

( * ) Notice: Subject to any disclaimer, the term of this patent is extended or adjusted under 35 U.S.C. 154(b) by 134 days.

(21) Appl. No.: 14/803,707

(22) Filed: Jul. 20, 2015

(65) Prior Publication Data

US 2016/0034104 A1 Feb. 4, 2016

(30) Foreign Application Priority Data

Jul. 29, 2014 (CN) .......................... 2014 1 0365906
Jul. 29, 2014 (CN) .......................... 2014 1 0367995

(51) Int. Cl.
*G06F 3/044* (2006.01)
*H01L 27/12* (2006.01)

(52) U.S. Cl.
CPC .......... *H01L 27/1244* (2013.01); *G06F 3/044* (2013.01); *G06F 2203/04102* (2013.01); *G06F 2203/04103* (2013.01)

(58) Field of Classification Search
CPC . G06F 2203/04102; G06F 2203/04103; G06F 3/044; H01L 27/1244
See application file for complete search history.

(56) References Cited

U.S. PATENT DOCUMENTS

| | | | |
|---|---|---|---|
| 2011/0037713 A1* | 2/2011 | Chen | G06F 3/041 345/173 |
| 2011/0261003 A1* | 10/2011 | Lee | G02F 1/13338 345/174 |
| 2014/0320760 A1* | 10/2014 | Ishizaki | G06F 3/044 349/12 |

(Continued)

FOREIGN PATENT DOCUMENTS

| | | |
|---|---|---|
| CN | 102445805 A | 5/2012 |
| CN | 103246409 A | 8/2013 |

(Continued)

*Primary Examiner* — Lisa Landis
(74) *Attorney, Agent, or Firm* — Muncy, Geissler, Olds & Lowe, P.C.

(57) ABSTRACT

A manufacturing method of an anti-interference flexible electronic structure formed by a carrier separation process comprises the steps of: providing a carrier; attaching a flexible substrate to the carrier; forming a plurality of touch-sensing units coplanarly on the flexible substrate, wherein a first interval region is formed between the adjacent touch-sensing units; coplanarly forming at least a first anti-interference spot within the first interval region, wherein a distance is between the first anti-interference spot and the adjacent touch-sensing unit; and separating the flexible substrate from the carrier.

19 Claims, 8 Drawing Sheets

(56) References Cited

U.S. PATENT DOCUMENTS

2015/0053336 A1\* 2/2015 Lim .................. G06F 3/044
  156/247
2015/0083464 A1\* 3/2015 Zilbauer ............ G06F 3/041
  174/251

FOREIGN PATENT DOCUMENTS

CN 103702518 A 4/2014
CN 103941900 A 7/2014

\* cited by examiner

FLEXIBLE ELECTRONIC DEVICE WITH ANTI-INTERFERENCE STRUCTURES AND MANUFACTURING METHOD THEREOF

CROSS REFERENCE TO RELATED APPLICATIONS

This Non-provisional application claims priority under 35 U.S.C. §119(a) on Patent Application No(s). 201410365906.3 and 201410367995.5 filed in People's Republic of China on Jul. 29, 2014, the entire contents of which are hereby incorporated by reference.

BACKGROUND OF THE INVENTION

Field of Invention

This invention relates to an electronic structure and a manufacturing method thereof and, in particular, to an anti-interference flexible electronic structure and a manufacturing method thereof.

Related Art

Recently, the touch technology has been widely applied to common consumer electronic products such as mobile phones, digital cameras, MP3, PDA (personal digital assistant), GPS (global positioning system), hand-held PC and UMPC (ultra mobile PC). However, the conventional touch-sensing structures suffer the problem of a decreasing product yield.

A conventional touch-sensing structure includes a substrate and a plurality of touch-sensing units. The touch-sensing units are disposed on the substrate and used to sense the user's touch to generate electric signals, and then the touch coordinates of the user can be obtained after processing the electric signals. However, since there is an interval just of 10 μm~30 μm between the touch-sensing units, the adjacent touch-sensing units will be easily short-circuited when particles fall down during the process, scratches happen or the touch-sensing units are bent. As a result, the malfunction of the touch product may happen and the product yield will be decreased.

Besides, for a flexible substrate, the possibility of suffering the short circuit is higher. When the flexible substrate is bent, the adjacent touch-sensing units will easily contact each other to result in a short circuit, and the malfunction of the touch product may happen and the product yield will be decreased therefore.

In addition, the conventional art uses the thinning process to form a flexible substrate, but this will cause many particles to fall on the flexible substrate, and the electric property of the touch-sensing units will be influenced thereby.

Therefore, it is important to provide an anti-interference flexible electronic structure and a manufacturing method thereof whereby the above-mentioned short circuit problems can be solved and the touch performance and product yield can be enhanced.

SUMMARY OF THE INVENTION

An aspect of the invention is to provide an anti-interference flexible electronic structure and a manufacturing method thereof whereby the above-mentioned short circuit problems can be solved and the touch function, product yield and flexibility can be enhanced.

Therefore, a manufacturing method of an anti-interference flexible electronic structure formed by a carrier separation process includes the steps of: providing a carrier; attaching a flexible substrate to the carrier; forming a plurality of touch-sensing units coplanarly on the flexible substrate, wherein a first interval region is formed between the adjacent touch-sensing units; coplanarly forming at least a first anti-interference spot within the first interval region, wherein a distance is between the first anti-interference spot and the adjacent touch-sensing unit; and separating the flexible substrate from the carrier.

In one embodiment, the touch-sensing units and the first anti-interference spot are made in the same processing step.

In one embodiment, the flexible substrate and the carrier have a physical contact therebetween.

In one embodiment, the physical contact comprises vacuum suction, magnetic suction, electrostatic suction or their any combination.

In one embodiment, the first anti-interference spot exhibits a zigzag pattern.

In one embodiment, an edge of the flexible substrate comprises a curved surface.

In one embodiment, by the first anti-interference spot disposed within the first interval region formed by the adjacent touch-sensing units, the interval between the adjacent touch-sensing units is enlarged, so as to provide the electrical anti-interference effect.

In one embodiment, the flexible substrate is a polymer substrate.

In one embodiment, the flexible substrate is an optical film.

In one embodiment, the optical film is a polarizing film, an anti-glare film or a brightness enhancement film.

In one embodiment, the carrier and the flexible substrate carried by the carrier are transported by a roller equipment or a robotic arm.

In one embodiment, the carrier is able to be recycled after the separation step.

Moreover, a flexible electronic structure formed by a carrier separation process includes a flexible substrate, a plurality of touch-sensing units and at least one first anti-interference spot. The touch-sensing units are coplanarly disposed on the flexible substrate. A first interval region is formed between the adjacent touch-sensing units. The first anti-interference spot is disposed within the first interval region. A distance is between the first anti-interference spot and the adjacent touch-sensing unit.

In one embodiment, the flexible electronic structure further comprises a ground unit and at least one second anti-interference spot. The ground unit is disposed coplanarly with the touch-sensing units. The grounding unit and the adjacent touch sensing unit have a second interval region therebetween. The second anti-interference spot is disposed in the second interval region.

In one embodiment, the flexible substrate and the carrier have a physical contact therebetween.

In one embodiment, the physical contact comprises vacuum suction, magnetic suction, electrostatic suction or their any combination.

In one embodiment, the first anti-interference spot exhibits a zigzag pattern.

In one embodiment, an edge of the flexible substrate comprises a curved surface.

In one embodiment, by the first anti-interference spot disposed within the first interval region formed by the adjacent touch-sensing units, the interval between the adjacent touch-sensing units is enlarged, so as to provide the electrical anti-interference effect.

In one embodiment, the flexible substrate is a polymer substrate.

In one embodiment, the flexible substrate is an optical film.

In one embodiment, the optical film is a polarizing film, an anti-glare film or a brightness enhancement film.

In one embodiment, the flexible electronic structure further comprises a protection layer covering the touch-sensing units and the first anti-interference spot.

As mentioned above, in the anti-interference flexible electronic structure and the manufacturing method thereof according to this invention, the first anti-interference spot is disposed in the first interval region formed by the adjacent touch-sensing units, and the interval between the touch-sensing units is enlarged thereby, for example, to 70 μm~130 μm from the original 10 μm~30 μm. Hence, even if the particles fall down or the scratch occurs during the process, the adjacent touch-sensing units won't be short-circuited. Therefore, the first anti-interference spots provide the electrical anti-interference effect, so as to prevent the malfunction of the touch product and enhance the product yield.

Moreover, when the flexible substrate is bent, the first anti-interference spot can prevent the contact between the adjacent touch-sensing units to avoid the short circuit, and the flexibility of the anti-interference flexible electronic structure can be enhanced thereby.

Furthermore, because the anti-interference flexible electronic structure of this invention is formed by the carrier separation process, the particles of the conventional thinning process won't be generated. Therefore, the problem of the short circuit of the touch-sensing units can be solved fundamentally.

In addition, the enlarged space between the touch-sensing units may make the human eyes perceive the existence of the touch-sensing units, but because the first anti-interference spot with a zigzag pattern is disposed between the adjacent touch-sensing units, the touch-sensing units will become invisible and the human eyes will not easily perceive their existence, so as to provide the optical anti-interference effect and enhance the display performance. Besides, the first anti-interference spot combined with the curved edge of the substrate can further provide the optical anti-interference effect and enhance the 3D display performance.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
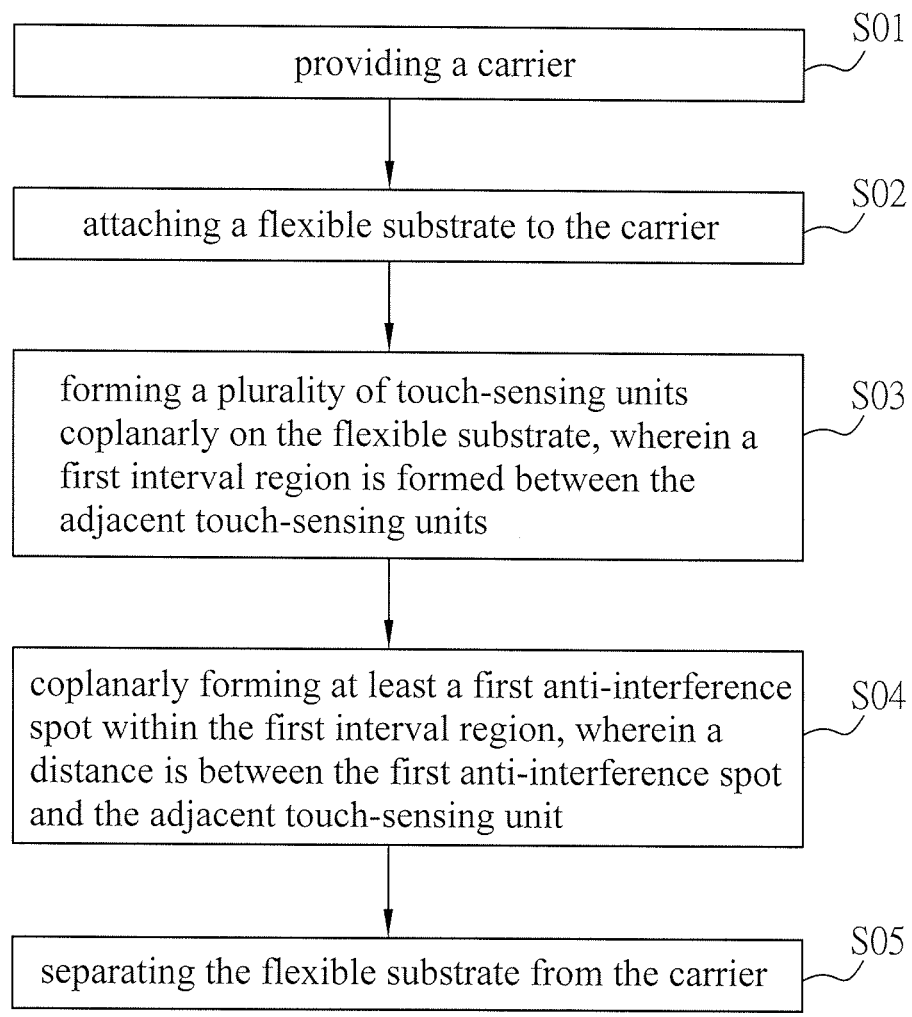
FIG. 1 is a schematic flowchart of the manufacturing method of an anti-interference flexible electronic structure of an embodiment of the invention.

FIG. 1 is a schematic flowchart of the manufacturing method of an anti-interference flexible electronic structure of an embodiment of the invention. FIGS. 2A to 2E are schematic diagrams of the manufacturing method of an anti-interference flexible electronic structure of an embodiment of the invention. FIG. 2E also shows the formed flexible electronic structure. As shown in FIGS. 1 and 2A to 2E, the manufacturing method of the anti-interference flexible electronic structure of this embodiment and the formed flexible electronic structure will be illustrated.

Figure 2A:
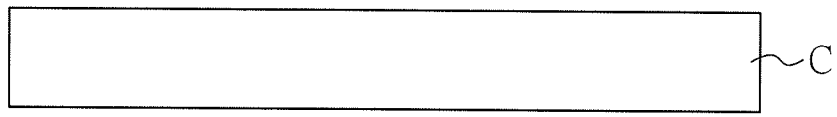
FIGS. 2A to 2E are schematic diagrams of the manufacturing method of an anti-interference flexible electronic structure of an embodiment of the invention.

As shown in FIG. 2A, the manufacturing method includes the step S01 of providing a carrier C. The carrier C is not limited in type, which is, for example, a glass substrate, a plastic substrate, a ceramic substrate or a sapphire substrate.

Figure 2B:
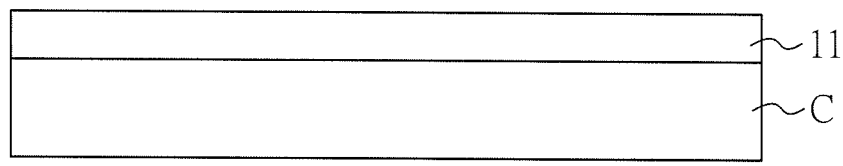

As shown in FIG. 2B, the manufacturing method includes the step S02 of attaching a flexible substrate 11 to the carrier C. The flexible substrate 11 is a polymer substrate for example. In function, the flexible substrate 11 can be an optical film for example, such as a polarizing film, an anti-glare film or a brightness enhancement film, so as to enhance the functionality of the product. The flexible substrate 11 can be a cover plate, a single layer membrane, a multilayer membrane or a combination thereof. In the application of the display panel, the flexible substrate 11 can be a cover glass, so as to decrease the thickness of the display panel. The edge of the cover glass can be a curved surface so as to enhance the 3D display performance. Moreover, the flexible substrate 11 can provide flexibility so that it can be applied to a flexible display panel or other flexible electronic products. Furthermore, the carrier C and the flexible substrate 11 carried by the carrier C can be transported by a roller equipment or a robotic arm. Besides, the flexible substrate 11 and the carrier C can be given a physical contact therebetween, and the physical contact includes, for example, vacuum suction, magnetic suction, electrostatic suction or their any combination.

Figure 2C:
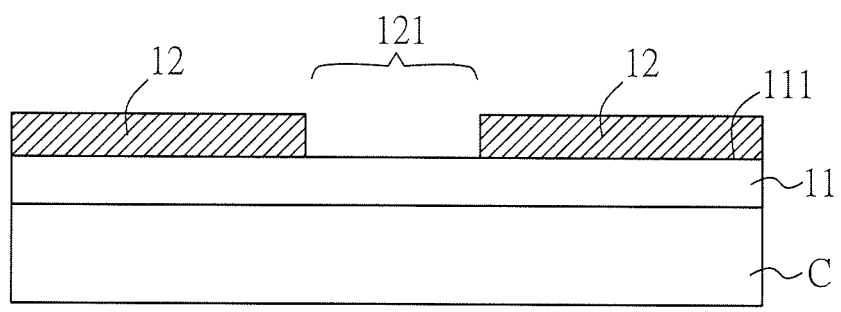

As shown in FIG. 2C, the manufacturing method includes the step S03 of forming a plurality of touch-sensing units 12 coplanarly on the flexible substrate 11, wherein a first interval region 121 is formed between the adjacent touch-sensing units 12. The touch-sensing units 12 are coplanarly disposed on the flexible substrate 11. Herein for example, the touch-sensing units 12 are disposed on a surface 111 of the flexible substrate 11 to form the coplanar disposition. A first interval region 121 is formed between the adjacent touch-sensing units 12. The touch-sensing units 12 can be made of transparent conducting material, such as indium tin oxide (ITO) or other metal oxides. The two touch-sensing units 12 shown in FIG. 2C are electrically insulated from each other for example.

Figure 2D:
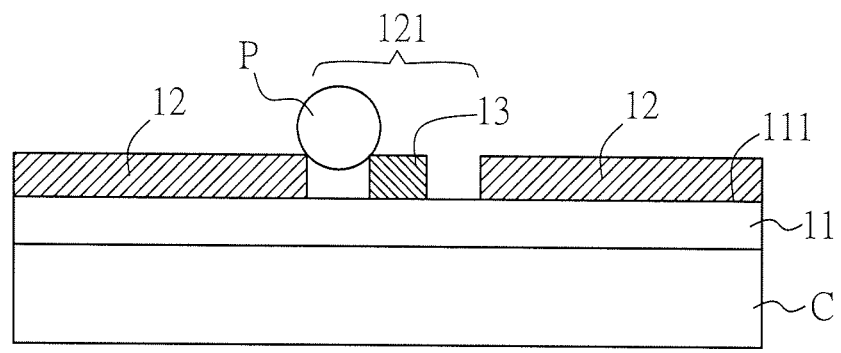
Figure 2E:
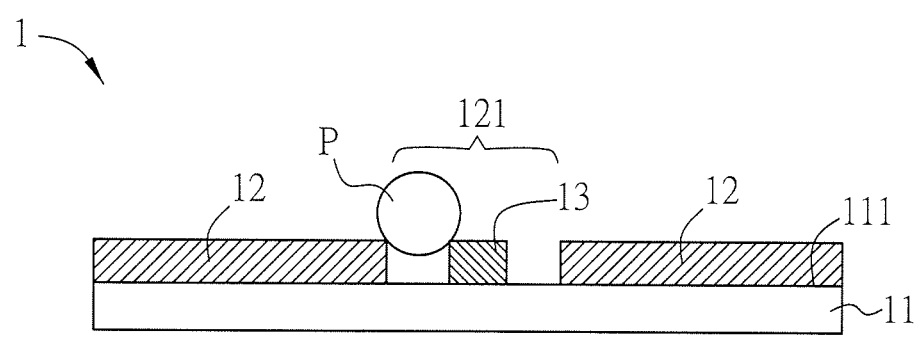

As shown in FIG. 2D, the manufacturing method includes the step S04 of coplanarly forming at least a first anti-interference spot 13 within the first interval region 121, wherein a distance is between the first anti-interference spot 13 and the adjacent touch-sensing unit 12. The first anti-interference spot 13 is disposed within the first interval region 121, and a distance is between the first anti-interference spot 13 and the adjacent touch-sensing unit 12. In practice, the first anti-interference spot 13 and the touch-sensing units 12 can be made in the same processing step (i.e. the steps S03 and S04 are executed at the same time) and made of the same material to reduce the processing steps. However, this invention is not limited thereto. Herein, the first anti-interference spot 13 is made of conducting material and is electrically floating. By disposing the first anti-interference spot 13 within the first interval region 121, the interval between the adjacent touch-sensing units 12

(first interval region 121) can be enlarged. Therefore, even if the particles P fall down or the scratch occurs, the adjacent touch-sensing units 12 won't be short-circuited, so as to prevent the malfunction of the touch product and enhance the product yield. By disposing the first anti-interference spot 13 within the first interval region 121 formed by the adjacent touch-sensing units 12, the interval between the adjacent touch-sensing units 12 can be enlarged. Thereby, the short circuit won't be caused even if the particle pollution of the subsequent process occurs, so as to provide the electrical anti-interference effect.

Moreover, the enlarged space between the touch-sensing units 12 may make the human eyes perceive the existence of the touch-sensing units 12, but because the first anti-interference spot 13 is disposed between the adjacent touch-sensing units 12, the human eyes will not easily perceive the existence of the touch-sensing units 12, and therefore the display performance won't be degraded. For example, the width of the first anti-interference spot 13 is between 50 μm and 70 μm, and the width of the first interval region 121 is between 70 μm and 130 μm. In one embodiment, the material of the first anti-interference spot 13 can include metal oxide. Moreover, the first anti-interference spots 13 can include a massive spot or a bent spot. The first anti-interference spot 13 can exhibit a bent pattern.

As shown in FIG. 2E, the manufacturing method includes the step S05 of separating the flexible substrate 11 from the carrier C. The separation manner is not limited in this embodiment, which can be a physical separation or a chemical separation for example. Herein since the flexible substrate and the carrier are given a physical contact for example, they can be separated from each other as long as the proper condition is applied (such as removing the vacuum, magnetic field or static electricity). In addition, the carrier C can be recycled after the separation step.

To be noted, in this embodiment, the anti-interference flexible electronic structure 1 is formed by the carrier separation process instead of the conventional thinning process, so that the generation of particles can be avoided in the process. Therefore, the problem of the short circuit resulted from the particles can be solved. In short, the conventional process is to directly form the touch-sensing units on a thicker substrate and then implement the thinning process (such as a mechanical thinning process, a chemical thinning process, a chemical-mechanical thinning process, a photolithography process, a thin film deposition process and/or a thin film etching process) to obtain a thinned substrate, i.e. the flexible substrate. However, the thinning process will generate many particles attached to the substrate to affect the electric property of the touch-sensing units. For example, the adjacent touch-sensing units are short circuited, and the malfunction of the touch product may happen and the product yield will be decreased therefore. However, in the process of this invention, the flexible substrate 11 is connected to a carrier, and the touch-sensing units, the first anti-interference spot and/or other circuits are formed on the flexible substrate by the machine. Then, the anti-interference flexible electronic structure 1 can be obtained after implementing the carrier separation process to remove the carrier. During the process, the particles won't be generated, so that the electric property can't be affected and the touch performance and the product yield can be enhanced. Moreover, in one embodiment, the total thickness of the carrier and the flexible substrate 11 can be made substantially the same as the thickness of the substrate of the conventional art. Thereby, the original machine can be used to form the touch-sensing units, the first anti-interference spot and/or other circuits on the flexible substrate, so as to save the cost.

Figure 3:
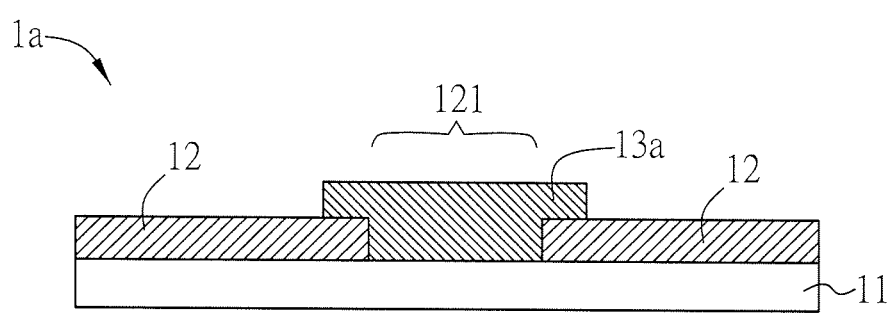
FIGS. 3 to 5 are schematic diagrams of the anti-interference flexible electronic structures of different embodiments of the invention.
Figure 4:
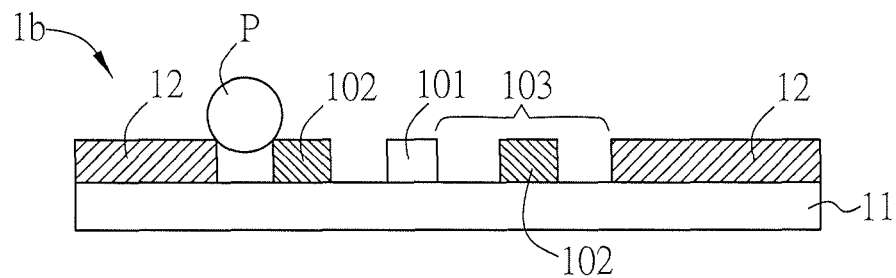
Figure 5:
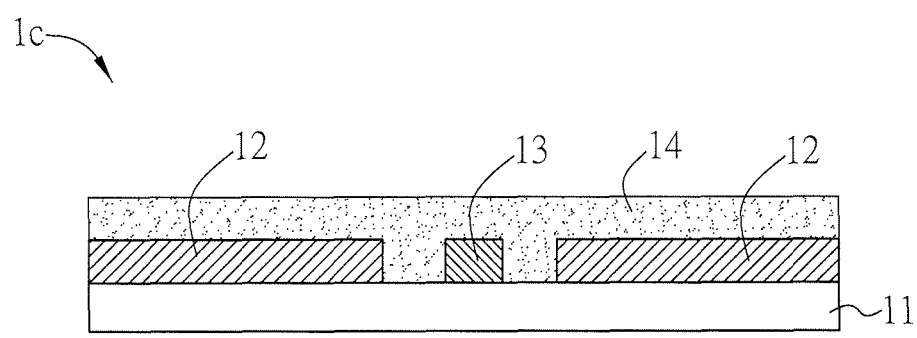

The flexible electronic structure 1 of FIG. 2E can have multiple variations, and some of them are illustrated in FIGS. 3 to 5 for example.

FIG. 3 is a schematic diagram of the anti-interference flexible electronic structure 1a of another embodiment of the invention. As shown in FIG. 3, the manufacturing method of the anti-interference flexible electronic structure 1a further includes a step of making the first anti-interference spot cover at least a part of the touch-sensing units 12 and filled into the first interval region 121. Herein, the first anti-interference spot 13a is made of insulating material such that the touch-sensing units 12 won't be short-circuited. The first anti-interference spot 13a can be made of transparent material so as to be pervious to the light.

FIG. 4 is a schematic diagram of the anti-interference flexible electronic structure 1b of another embodiment of the invention. As shown in FIG. 4, the manufacturing method of the anti-interference flexible electronic structure 1b further includes steps of: coplanarly forming a grounding unit 101 with the touch-sensing units 12, wherein a second interval region 103 is formed between the grounding unit 101 and the adjacent touch-sensing unit 12; and coplanarly forming at least a second anti-interference spot 102 within the second interval region 103, wherein a distance is between the second anti-interference spot 102 and the adjacent touch-sensing unit 12 and between the second anti-interference spot 102 and the grounding unit 101. Likewise, in practice, the second anti-interference spot 102 and the touch-sensing units 12 can be made in the same processing step and made of the same material to reduce the processing steps. However, this invention is not limited thereto. Herein, the second anti-interference spot 102 is made of conducting materials and is electrically floating. By disposing the second anti-interference spot 102 within the second interval region 103, the interval between the touch-sensing unit 12 and the grounding unit 101 (second interval region 103) can be enlarged. Therefore, even if the particles P fall down or the scratch occurs, the touch-sensing unit 12 and the adjacent grounding unit 101 won't be short-circuited, so as to prevent the malfunction of the touch product and enhance the product yield. For example, the width of the second anti-interference spot 102 is between 50 μm and 70 μm, and the width of the second interval region 103 is between 70 μm and 130 μm.

FIG. 5 is a schematic diagram of the anti-interference flexible electronic structure 1c of another embodiment of the invention. As shown in FIG. 5, the manufacturing method of the anti-interference flexible electronic structure 1c further includes a step of forming a protection layer 14 to cover the touch-sensing units 12 and the first anti-interference spot 13. Herein, the protection layer 14 is disposed on the flexible substrate 11 to cover the touch-sensing units 12 and the first anti-interference spot 13, and the protection layer 14 is non-patterned for example. Of course, in other embodiments, the protection layer 14 may be patterned.

To be noted, the technical features as mentioned above can be implemented separately or in combination.

Figure 7:
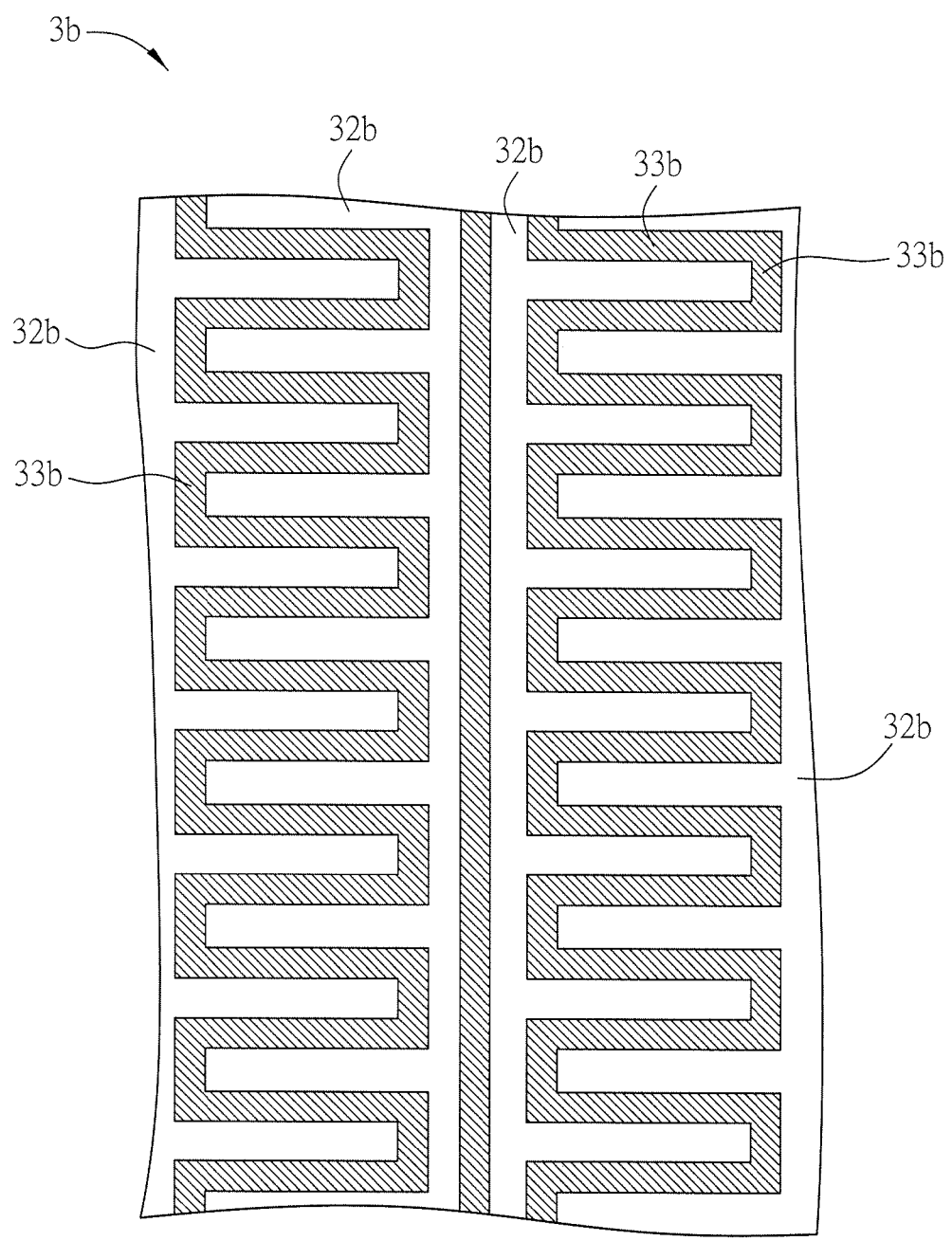
Figure 8:
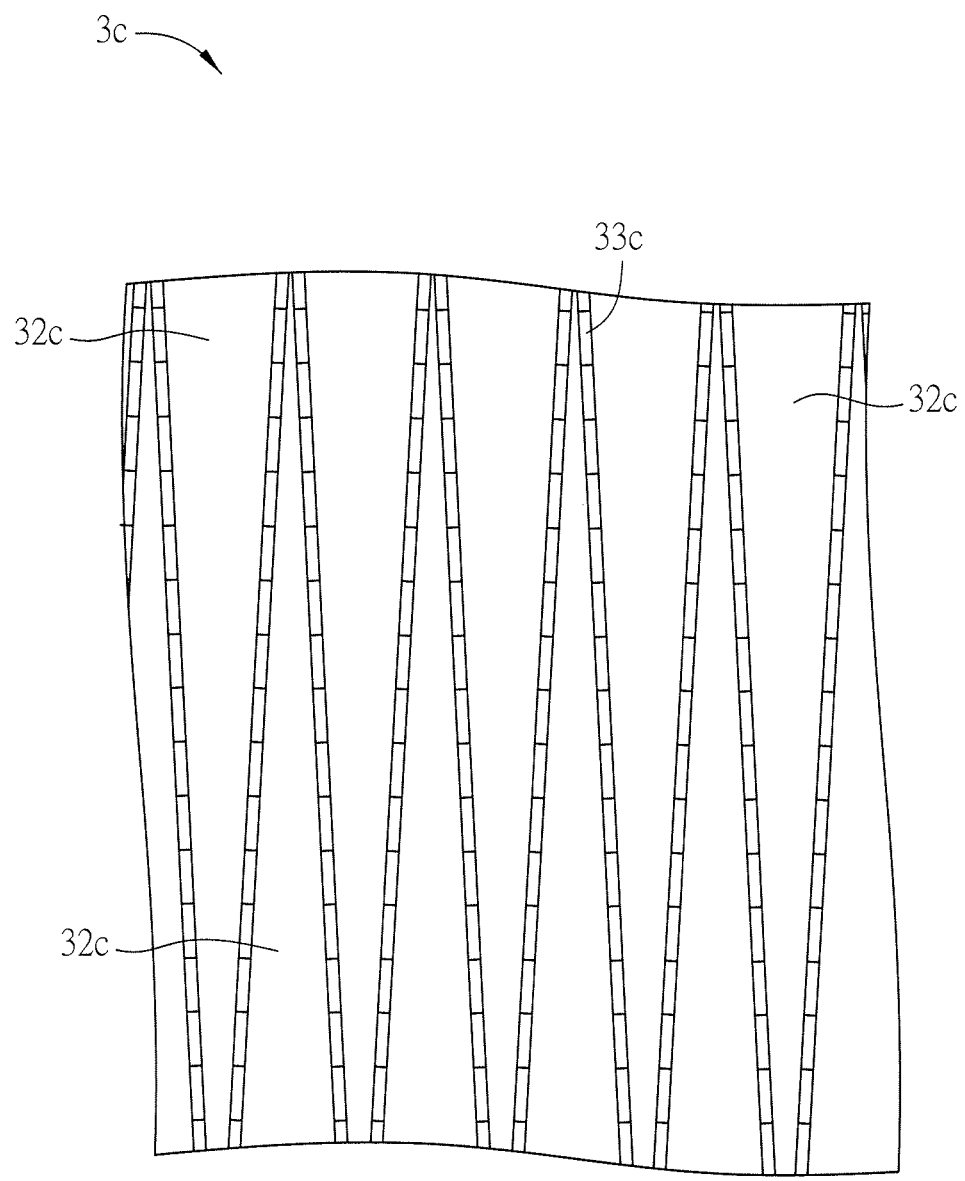

In a top view, the shapes of the touch-sensing unit, first anti-interference spot, grounding unit and second anti-interference spot are not limited, which can be, for example, a curved shape, a triangle, a quadrangle (such as a rhombus), another polygon or a combination thereof. Herein, some examples are illustrated in FIGS. 6 to 8.

Figure 6:
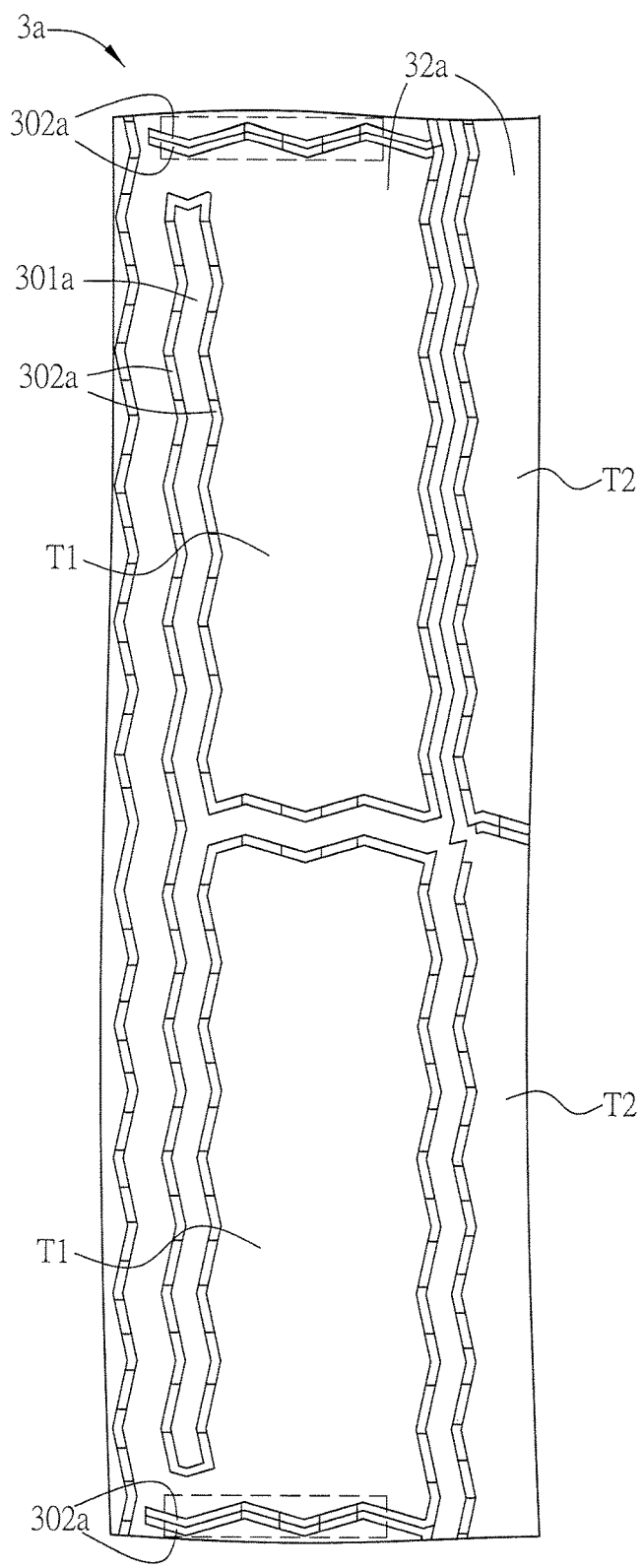
FIGS. 6 to 8 are schematic top views of the anti-interference flexible electronic structures of different embodiments of the invention.

FIG. 6 is a schematic top view of an anti-interference flexible electronic structure 3a of an embodiment of the invention. For the convenient illustration, FIG. 6 just shows the touch-sensing unit 32a, the second anti-interference spot 302a and the grounding unit 301a. The touch-sensing unit 32a has a quadrangle-like shape. The grounding unit 301a is disposed around the touch-sensing unit 32a and, for example, between the adjacent touch-sensing units 32a. Moreover, the anti-interference spot (second anti-interference spot 302a for example) is disposed within the second interval region formed by the grounding unit 301a and the touch-sensing unit 32a. Herein, the second anti-interference spot 302a is disposed on at least one side of the touch-sensing unit 32a or around the whole touch-sensing unit 32a.

Moreover, in this embodiment, the first anti-interference spots or the second anti-interference spots can be disposed adjacent to each other. For example, the dotted block in FIG. 6 shows two second anti-interference spots 302a disposed adjacent to each other. Therefore, the width of the two adjacent second anti-interference spots 302a can be between 100 μm and 140 μm, and the width of the second interval region can be between 120 μm and 200 μm. The same disposition also can be applied to the first anti-interference spot, and the related description is omitted here for conciseness.

Furthermore, the touch-sensing units 32a can include a plurality of first touch-sensing elements T1 and a plurality of second touch-sensing elements T2. The first touch-sensing elements T1 serve as the transmitters and the second touch-sensing elements T2 serve as the receivers. The transmitters are coupled with an excitation signal (not shown). When the user touches, the capacitance between the first touch-sensing element T1 and the second touch-sensing element T2 is changed so that the touch coordinates can be obtained.

In other embodiments, the touch-sensing units 32 can include a plurality of first touch-sensing elements electrically connected with each other along a first direction and a plurality of second touch-sensing elements electrically connected with each other along a second direction. For example, the first direction is X direction and the second direction is Y direction. Thereby, the touch coordinates of the user can be obtained after the signal process. Since the conventional art can be applied thereto, the related description is omitted here for conciseness.

FIG. 7 is a schematic top view of an anti-interference flexible electronic structure 3b of an embodiment of the invention. For the convenient illustration, FIG. 7 just shows the touch-sensing unit 32b and the first anti-interference spot 33b. The touch-sensing unit 32b has a bent shape. Moreover, the anti-interference spot (first anti-interference spot 33b for example) is disposed within the first interval region formed by the adjacent touch-sensing units 32b. Herein, the first anti-interference spot 33b exhibits a zigzag pattern and is disposed on at least one side of the touch-sensing unit 32b or around the whole touch-sensing unit 32b.

FIG. 8 is a schematic top view of an anti-interference flexible electronic structure 3c of an embodiment of the invention. For the convenient illustration, FIG. 8 just shows the touch-sensing unit 32c and the first anti-interference spot 33c. The touch-sensing unit 32c has a triangular shape and the touch-sensing units 32c are disposed side by side. Moreover, the anti-interference spot (first anti-interference spot 33c for example) is disposed within the first interval region formed by the adjacent touch-sensing units 32c. Herein, the first anti-interference spot 33c has a strip-like shape and is disposed on at least one side of the touch-sensing unit 32c or around the whole touch-sensing unit 32c.

Summarily, in the anti-interference flexible electronic structure and the manufacturing method thereof according to this invention, the first anti-interference spot is disposed in the first interval region formed by the adjacent touch-sensing units, and the interval between the touch-sensing units is enlarged thereby, for example, to 70 μm~130 μm from the original 10 μm~30 μm. Hence, even if the particles fall down or the scratch occurs during the process, the adjacent touch-sensing units won't be short-circuited. Therefore, the first anti-interference spots provide the electrical anti-interference effect, so as to prevent the malfunction of the touch product and enhance the product yield.

Moreover, when the flexible substrate is bent, the first anti-interference spot can prevent the contact between the adjacent touch-sensing units to avoid the short circuit, and the flexibility of the anti-interference flexible electronic structure can be enhanced thereby.

Furthermore, because the anti-interference flexible electronic structure of this invention is formed by the carrier separation process, the particles of the conventional thinning process won't be generated. Therefore, the problem of the short circuit of the touch-sensing units can be solved fundamentally.

In addition, the enlarged space between the touch-sensing units may make the human eyes perceive the existence of the touch-sensing units, but because the first anti-interference spot with a zigzag pattern is disposed between the adjacent touch-sensing units, the touch-sensing units will become invisible and the human eyes will not easily perceive their existence, so as to provide the optical anti-interference effect and enhance the display performance. Besides, the first anti-interference spot combined with the curved edge of the substrate can further provide the optical anti-interference effect and enhance the 3D display performance.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of a flexible electronic structure formed by a carrier separation process, comprising steps of:
   providing a carrier;
   attaching a flexible substrate to the carrier;
   forming a plurality of touch-sensing units coplanarly on the flexible substrate, wherein a first interval region is formed between the adjacent touch-sensing units;
   coplanarly forming at least one first anti-interference spot within the first interval region, wherein a distance is between the at least one first anti-interference spot and the adjacent touch-sensing unit;
   coplanarly forming a ground unit with the plurality of touch-sensing units, wherein the grounding unit and the adjacent touch-sensing unit have a second interval region therebetween;
   forming at least one second anti-interference spot within the second interval region, wherein both the plurality of touch-sensing units and the ground unit are disposed coplanarly with the at least one second anti-interference spot; and
   separating the flexible substrate from the carrier.

2. The manufacturing method as recited in claim 1, wherein the plurality of touch-sensing units and the at least one first anti-interference spot are made in the same processing step.

3. The manufacturing method as recited in claim 1, wherein the flexible substrate and the carrier have a physical contact therebetween.

4. The manufacturing method as recited in claim 3, wherein the physical contact comprises vacuum suction, magnetic suction, electrostatic suction or a combination thereof.

5. The manufacturing method as recited in claim 1, wherein the at least one first anti-interference spot exhibits a zigzag pattern.

6. The manufacturing method as recited in claim 1, wherein an edge of the flexible substrate comprises a curved surface.

7. The manufacturing method as recited in claim 1, wherein by the at least one first anti-interference spot disposed within the first interval region formed by the adjacent touch-sensing units, the interval between the adjacent touch-sensing units is enlarged, so as to provide an electrical anti-interference effect.

8. The manufacturing method as recited in claim 1, wherein the carrier and the flexible substrate carried by the carrier are transported by a roller equipment or a robotic arm.

9. The manufacturing method as recited in claim 1, wherein the carrier is able to be recycled after the separation step.

10. A flexible electronic structure, comprising:
a flexible substrate;
a plurality of touch-sensing units coplanarly disposed on the flexible substrate, wherein a first interval region is formed between the adjacent touch-sensing units;
at least one first anti-interference spot disposed within the first interval region, wherein a distance is between the at least one first anti-interference spot and the adjacent touch-sensing unit;
a ground unit disposed coplanarly with the plurality of touch-sensing units, wherein the ground unit and the adjacent touch-sensing unit have a second interval region therebetween; and
at least one second anti-interference spot disposed in the second interval region, wherein both the plurality of touch-sensing units and the ground unit are disposed coplanarly with the at least one second anti-interference spot.

11. The flexible electronic structure as recited in claim 10, wherein the flexible substrate and a carrier have a physical contact therebetween.

12. The flexible electronic structure as recited in claim 11, wherein the physical contact comprises vacuum suction, magnetic suction, electrostatic suction or their any combination.

13. The flexible electronic structure as recited in claim 10, wherein the at least one first anti-interference spot exhibits a zigzag pattern.

14. The flexible electronic structure as recited in claim 10, wherein an edge of the flexible substrate comprises a curved surface.

15. The flexible electronic structure as recited in claim 10, wherein by the at least one first anti-interference spot disposed within the first interval region formed by the adjacent touch-sensing units, the interval between the adjacent touch-sensing units is enlarged, so as to provide an electrical anti-interference effect.

16. The flexible electronic structure as recited in claim 10, wherein the flexible substrate is a polymer substrate.

17. The flexible electronic structure as recited in claim 10, wherein the flexible substrate is an optical film.

18. The flexible electronic structure as recited in claim 17, wherein the optical film is a polarizing film, an anti-glare film or a brightness enhancement film.

19. The flexible electronic structure as recited in claim 10, further comprising:
a protection layer covering the plurality of touch-sensing units and the at least one first anti-interference spot.

* * * * *